(12) United States Patent
Ngo et al.

(10) Patent No.: US 6,383,925 B1
(45) Date of Patent: *May 7, 2002

(54) METHOD OF IMPROVING ADHESION OF CAPPING LAYERS TO COOPER INTERCONNECTS

(75) Inventors: Minh Van Ngo, Freemont; Lu You, Santa Clara; Robert A. Huertas, Hollister; Ercan Adem, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/497,850

(22) Filed: Feb. 4, 2000

(51) Int. Cl.$^7$ .............................................. H01L 21/44
(52) U.S. Cl. ........................ 438/677; 438/658; 438/674; 438/676; 438/687
(58) Field of Search ................................ 438/658, 674, 438/676, 677, 687

(56) References Cited

U.S. PATENT DOCUMENTS

| | | |
|---|---|---|
| 4,789,648 A | 12/1988 | Chow et al. |
| 5,447,887 A | 9/1995 | Filipiak et al. |
| 5,621,241 A | 4/1997 | Jain |
| 5,693,563 A | 12/1997 | Teong |
| 6,146,988 A * | 11/2000 | Ngo et al. .................... 438/618 |
| 6,147,000 A * | 11/2000 | You et al. ..................... 438/687 |
| 6,153,523 A * | 11/2000 | Van Ngo et al. ............. 438/687 |
| 6,165,894 A * | 12/2000 | Pramanick et al. .......... 438/627 |
| 6,171,960 B1 * | 1/2001 | Lee .............................. 438/687 |
| 6,174,810 B1 * | 1/2001 | Islam et al. .................. 438/687 |
| 6,177,347 B1 * | 1/2001 | Liu et al. ..................... 438/675 |
| 6,211,084 B1 * | 4/2001 | Ngo et al. .................... 438/687 |
| 6,211,085 B1 * | 4/2001 | Liu .............................. 438/687 |
| 6,214,731 B1 * | 4/2001 | Nogami et al. .............. 438/687 |

OTHER PUBLICATIONS

"Passivation of copper by formation in dilute silane" S. Hymes and S. P. Muraka—C. Shepard and W. A. Ianford Jan. 25, 1992—pp. 4623–4625.

* cited by examiner

Primary Examiner—Matthew Smith
Assistant Examiner—Lex H. Malsawma

(57) ABSTRACT

The adhesion of a barrier or capping layer to a Cu or Cu alloy interconnect member is significantly enhanced by treating the exposed surface of the Cu or Cu alloy interconnect member, after CMP, in a reaction chamber with a plasma containing ammonia and nitrogen for a brief period of time to reduce the surface oxide and then introducing silane into the reaction chamber to deposit the barrier layer, e.g., silicon nitride, under high density plasma conditions in the presence of nitrogen. The presence of nitrogen during plasma oxide layer reduction and plasma barrier layer deposition significantly improves adhesion of the barrier layer to the Cu or Cu alloy surface.

10 Claims, 2 Drawing Sheets

METHOD OF IMPROVING ADHESION OF CAPPING LAYERS TO COOPER INTERCONNECTS

TECHNICAL

The present invention relates to copper (Cu) and/or Cu alloy metallization in semiconductor devices. The present invention is applicable to manufacturing high-speed integrated circuits having submicron design features and high conductivity interconnect structures.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnect pattern, particularly wherein submicron vias, contacts and trenches have high aspect ratios imposed by miniaturization.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometric shrink to submicron levels.

A conductive plug filling a via hole is typically formed by depositing an interdielectric layer on a conductive layer comprising at least one conductive pattern, forming an opening through the interdielectric layer by conventional photolithographic and etching techniques, and filling the opening with a conductive material, such as tungsten (W). Excess conductive material on the surface of the interlayer dielectric is typically removed by chemical-mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

Cu and Cu alloys have received considerable attention as candidates for replacing Al in interconnect metallizations. Cu is relatively inexpensive, easy to process, and has a lower resistively than Al. In addition, Cu has improved electrical properties vis-à-vis W, making Cu a desirable metal for use as a conductive plug as well as conductive wiring. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), Tungsten (W), tungsten nitride (WN), Ti-TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the interlayer dielectric, but includes interfaces with other metals as well.

There are additional problems attendant upon conventional Cu interconnect methodology employing a diffusion barrier layer (capping layer). For example, conventional practices comprise forming a damascene opening in an interdielectric layer, depositing a barrier layer such as TaN, lining the opening and on the surface of the interdielectric layer, filling the opening with Cu or a Cu alloy layer, CMP, and forming a capping layer on the exposed surface of the Cu or Cu alloy. It was found, however, that capping layers, such as silicon nitride, deposited by plasma enhanced chemical vapor deposition (PECVD), exhibit poor adhesion to the Cu or Cu alloy surface. Consequently, the capping layer is vulnerable to detamination, as by peeling due to scratching, stresses or poor adhesion resulting from subsequent deposition of layers. As a result, the Cu or Cu alloy is not entirely encapsulated and Cu diffusion occurs, thereby adversely affecting device performance and decreasing the electromigration resistance of the Cu or Cu alloy interconnect member. Moreover, conventional PECVD silicon nitride capping layers have a density of about 2.62 g/cm$^3$ and, hence, are not particularly effective as an etch stop layer furring formation of interconnects for subsequent metallization levels.

In application Ser. No. 09/131,872 filed on Aug. 10, 1998 now U.S. Pat. No. 6,165,894 issued Dec. 26, 2000 the adhesion problem of a silicon nitride capping layer to a Cu interconnect was addressed by treating the exposed surface with an ammonia-containing plasma and depositing a silicon nitride capping layer thereon. In application Ser. No. 09/208, 245 filed on Dec. 9, 1998 now U.S. Pat. No. 6,253,523 issued Nov. 28, 2000, the adhesion problem of a silicon nitride capping layer to a Cu interconnect was addressed by initially treating the exposed surface with an ammonia-containing plasma and then depositing a silicon nitride capping layer thereon under high density plasma conditions.

As design rules extend deeper into the submicron range, such as about 0.18 micron and under,. e.g., about 0.15 micron and under, the reliability of the interconnect pattern becomes increasingly critical. Therefore, the adhesion of capping layers to Cu interconnects and the accuracy of interconnects for vertical metallization levels require even greater reliability. Accordingly, there exists a need for methodology enabling the formation of encapsulated Cu and Cu alloy interconnect members for vertical metallization levels with greater accuracy and reliability.

DISCLOSURE OF THE INVENTION

An advantage of the present invention is a method of manufacturing a semiconductor device having highly reliable Cu or Cu alloy interconnect members.

Another advantage of the present invention is an efficient, cost-effective method of manufacturing a semiconductor device comprising a Cu or Cu alloy interconnect member having a dense silicon nitride capping layer tightly adhered thereto.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: treating a surface of a copper (Cu) or Cu alloy layer with a plasma containing nitrogen and ammonia in a reaction chamber to reduce copper oxide on the surface; and in-situ forming a barrier layer on the treated surface of the Cu or Cu alloy layer under high density plasma conditions in the presence of nitrogen in the same reaction chamber.

Embodiments of the present invention comprise treating the surface of the Cu or Cu alloy layer within a plasma containing ammonia and nitrogen for up to about 30 seconds, e.g., about 1 to about 5 seconds, to reduce the copper oxide on the surface, and then introducing silane into the same reaction chamber to deposit a silicon nitride barrier layer on the treated surface in the presence of nitrogen. Embodiments of the present invention further include depositing a silicon nitride barrier layer under high density plasma conditions in the presence of ammonia, nitrogen and silane for about 1 to about 5 seconds to form a silicon nitride barrier layer at a thickness of about 150 Å to about 1,000 Å.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
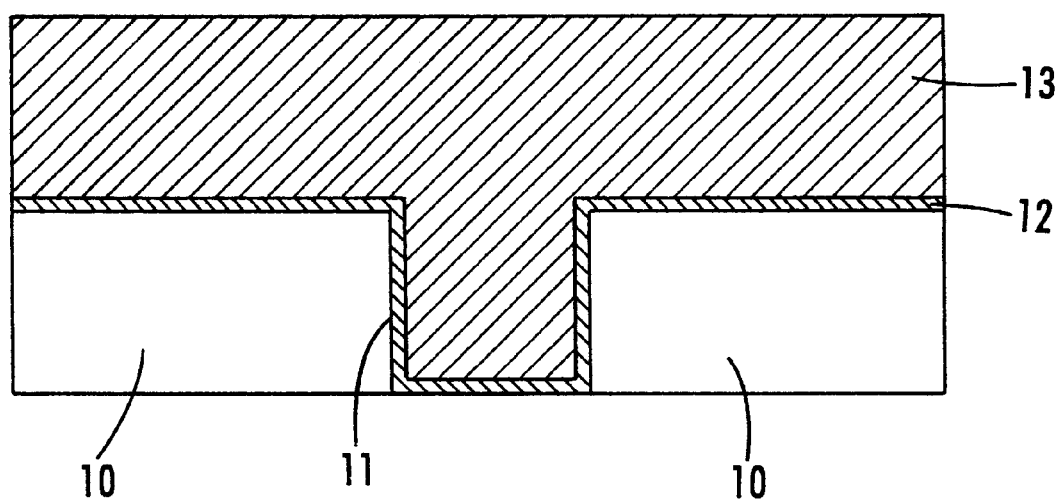
FIGS. 1–4 illustrate sequential phases of a method in accordance with an embodiment of the present invention.

The present invention addresses and solves problems attendant upon capping a Cu or Cu alloy interconnect, as with a capping or barrier layer of silicon nitride. Methodology in accordance with embodiments of the present invention enables a significant improvement in the adhesion of a barrier layer, such as silicon nitride, to a Cu or Cu alloy interconnect member, thereby preventing barrier layer peeling, preventing diffusion and enhancing electromigration resistance. In addition, the present invention provides methodology enabling the deposition of a barrier layer, such as silicon nitride, having a significantly increased density thereby significantly enhancing the ability of the barrier layer to function as an etch stop layer during formation of interconnects for subsequent metallization levels. As employed throughout this application, the symbol Cu is intended to encompass high purity elemental copper as well as Cu-based alloys, such as Cu alloys containing minor amounts of tin, zinc, maganese, titanium, magnesium and germanium.

As design rules are scaled down into the deep submicron range, such about 0.18 micron and under, e.g., about 0.15 micron and under, the reliability of encapsulated Cu and/or Cu alloy interconnect members becomes increasingly significant. It was found that conventional practices in forming a Cu and/or Cu alloy interconnect member in a damascene opening result in the formation of a thin copper oxide surface film, believed to comprise a mixture of CuO and $Cu_2O$ formed during CMP. The thin copper oxide surface film layer is porous and brittle in nature. The presence of such a think copper oxide surface film undesirably reduces the adhesion of a barrier layer, such as silicon nitride, to the underlying Cu and/or Cu alloy interconnect member. Consequently, cracks are generated at the Cu or Cu alloy/ silicon nitride interface, resulting in copper diffusion and increased electromigration as a result of such diffusion. The cracks occurring in the Cu or Cu alloy/copper oxide interface enhance surface diffusion, which is more rapid than grain boundary diffusion or lattice diffusion, In U.S. patent application Ser. No. 09/208,245 now U.S. Pat. No. 6,153,523, a method is disclosed to improve adhesion of the barrier layer, such as silicon nitride, by treating the Cu surface with an ammonia-containing plasma to roughen the surface prior to depositing a high density plasma barrier layer thereon. In accordance with embodiments of the present invention, the methodology disclosed in application Ser. No. 09/208,245 now U.S. Pat. No. 6,153, 523 is improved by, inter alia, introducing nitrogen/$NH_3$ during treatment of the copper surface to remove the copper oxide layer and during deposition of the barrier layer, e.g., silicon nitride. The presence of nitrogen during oxide layer removal and barrier layer deposition enhances the adhesion of the barrier layer, e.g., silicon nitride, to the copper surface.

The precise mechanism by which the presence of nitrogen during plasma treatment to remove the oxide layer and during plasma deposition of a silicon nitride barrier layer improves adhesion of the barrier layer to the treated copper surface is not known with certainty. However, it is believed that nitrogen forms a thin transition layer or bridge between a silicon nitride barrier layer and the copper surface for improved adhesion. Such a thin transition layer can have a thickness of about 2 Å to about 10 Å.

Embodiments of the present invention include treating the copper surface with a plasma containing ammonia and nitrogen in a reaction chamber for a short period of time, e.g., up to about 30 seconds, such as about 1 second to about 5 seconds, e.g., about 3.5 seconds, to effect oxide layer removal and then introducing silane into the same reaction chamber to deposit a silicon nitride barrier layer. The use of a single reaction chamber for oxide reduction and silicon nitride deposition ensures a clean interface between the copper and barrier layer free of oxide.

Given the present disclosure and objectives, the conditions during plasma treatment to remove the oxide layer and during plasma deposition of the barrier layer can be optimized in a particular situation. For example, it was found suitable to treat the exposed surface of the Cu or Cu alloy layer in a high density plasma at an ammonia flow rate of about 100 sccm to about 6,000 sccm, a nitrogen flow rate of about 500 sccm to about 6,000 sccm, a high frequency power of about 100 to about 1,000 watts e.g., about 700 watts, a low frequency power of about 50 to about 500 watts, e.g., about 300 watts, a pressure of about 1.2 to 4 Torr. and a temperature of about 300 to about 450° C. for a period of about 1 to about 5 seconds. At the end of that period of time, silane can be introduced at a flow rate of about 20 to about 1,000 sccm to deposit the silicon nitride barrier layer under essentially the same conditions as during treatment to remove the oxide layer. The deposition time can be controlled, e.g., about 0.5 to about 5 seconds, to deposit a silicon nitride barrier layer having a thickness of about 150 Å to 1,000 Å and a density of about 2.67 to about 2.77 $g/cm^3$.

Cu and/or Cu alloy interconnect members formed in accordance with embodiments of the present invention can be, but are not limited to, interconnects formed by damascene technology. Thus, embodiments of the present invention include forming an interlayer dielectric overlying a substrate, forming an opening, e.g., a damascene opening, in the interlayer dielectric, depositing a diffusion barrier layer, such as TaN, and filling the opening with Cu or a Cu alloy layer. Advantageously, the opening in the interlayer dielectric can be filled by initially depositing a seed layer and then electroplating or electroless plating the Cu or Cu alloy layer. CMP is then performed such that the upper surface of the Cu or Cu alloy layer is substantially coplanar with the upper surface of the interlayer dielectric. As a result of CMP, a thin film of copper oxide is typically formed. In accordance with embodiments of the present invention, the exposed oxidized surface of the Cu or Cu alloy is treated with a plasma containing ammonia and nitrogen to remove or substantially reduce the thin copper oxide film, thereby presenting a clean surface upon which a diffusion barrier layer or capping layer, such as silicon nitride, is then deposited, e.g., directly deposited, under high density plasma conditions in the presence of nitrogen in the same reaction chamber.

In accordance with embodiments of the present invention, the damascene opening can also be filled with Cu or a Cu alloy by PVD at a temperature of about 50° C. to about 150° C. or by CVD at a temperature under about 200° C. In various embodiments of the present invention, conventional substrates and interlayer dielectrics, can be employed. For example, the substrate can be doped monocrystalline silicon or gallium-arsenic. The interlayer dielectric employed in the present invention can comprise any dielectric material conventionally employed in the manufacture of semiconductor devices. For example, dielectric materials such as silicon dioxide, phosphorous-doped silicate-glass (PSG), boron doped PSG (BPSG), and silicon dioxide derived from tetraethylorthosilicate (TEOS) or silane by PECVD can be employed. The openings formed in dielectric layers are effected by conventional photolithographic and etching techniques. Interdielectric layers in accordance with the present invention can also comprise low dielectric constant materials, including polymers, such a polyamides.

An embodiment of the present invention is schematically illustrated in FIGS. 1–4, wherein similar reference numerals denote similar features. Adverting to FIG. 1, damascene opening 11, such as a contact or via hole, is formed in dielectric layer 10, e.g., silicon dioxide. It should be understood that opening 11 can also be formed as a dual damascene opening comprising a contact or via whole section in communication with a trench section. A barrier layer 12 is deposited, such as TaN. Cu or a Cu alloy layer 13 is then deposited. Upon electroplating or electroless plating layer 13, a seed layer (not shown) is deposited on barrier layer 12.

Figure 2:
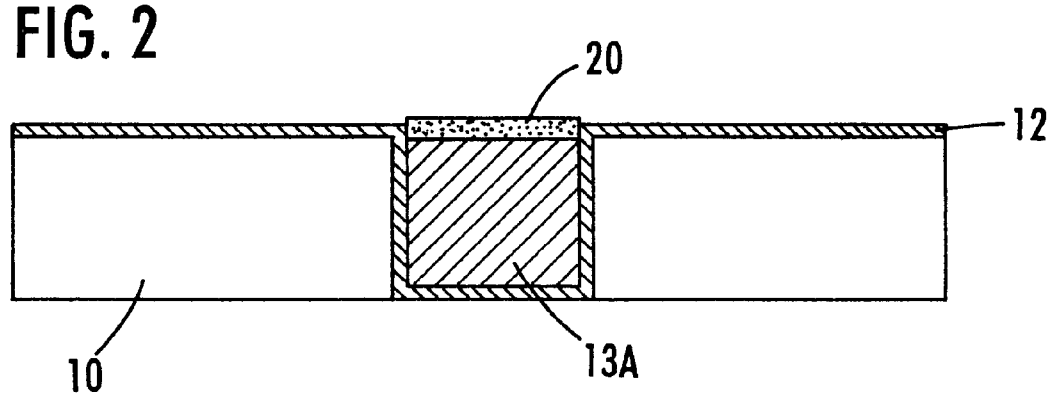

Adverting to FIG. 2, the portions of the Cu or Cu alloy layer 13 extending beyond opening 11 are removed, as by CMP. As a result, a thin film of copper oxide 20 is formed on the exposed surface of the Cu or Cu alloy interconnect member 13A.

Figure 3:
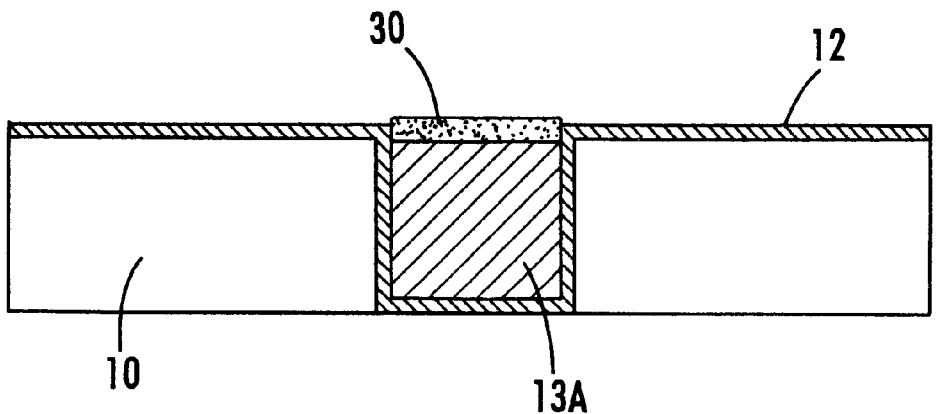
Figure 4:
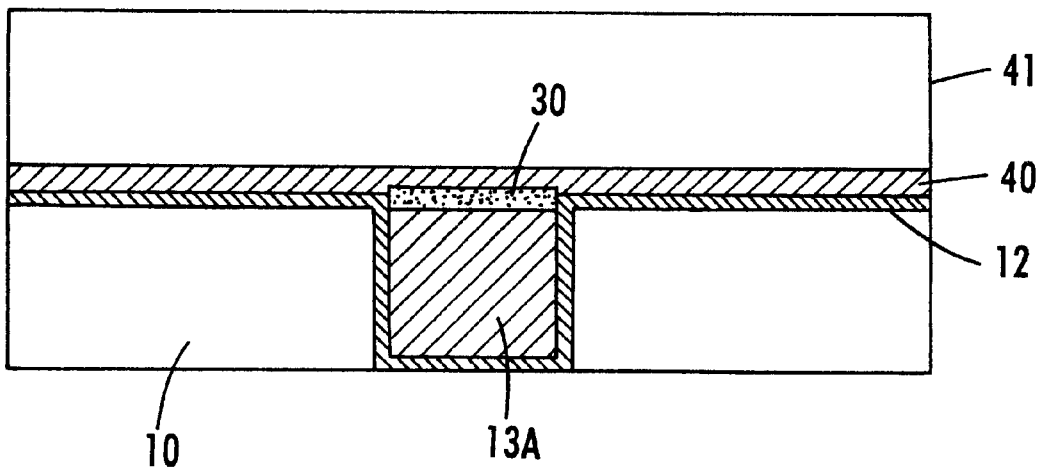

Adverting to FIG. 3, in accordance with embodiments of the present invention, the exposed surface of the Cu or Cu alloy interconnect member 13A having a thin copper oxide film 20 thereon is treated in a reaction chamber with a plasma containing ammonia and nitrogen for about 1 to about 5 seconds to remove or substantially reduce the thin copper oxide film 20 leaving a clean reduced Cu or Cu alloy surface 30. Silane is then introduced into the same reaction chamber to form a high density plasma silicon nitride capping layer 40 in the presence of nitrogen, as shown in FIG. 4, on the cleaned exposed surface 30 of Cu or Cu alloy interconnect 13. The high density plasma silicon nitride capping layer completely encapsulates the Cu or Cu alloy interconnect 13. Another interdielectric layer 41 is then deposited, such as silicon dioxide derived from TEOS or silane. In this way, a plurality of dielectric interlayers and metallization patterns are built up on a semiconductor substrate and various interconnects are formed.

Advantageously, the high density plasma silicon nitride capping layer 40 is tightly adhered to the underlying Cu or Cu alloy interconnect 13A by introducing nitrogen/$NH_3$ during plasma treatment to remove the oxide layer and during high density plasma deposition of the silicon nitride barrier layer. The integrity of the adhesion of the barrier layer is further improved by conducting both oxide layer removal and barrier layer deposition in the same reaction chamber, thereby minimizing the possibility of oxide contamination at the interface between the Cu or Cu alloy layer and the barrier layer. In addition, by employing the same reaction chamber for both plasma oxide removal and plasma barrier layer deposition, throughput is significantly enhanced, e.g., a 15% increase in throughput is obtained. High density plasma silicon nitride barrier layer 40 advantageously exhibits significantly improved etch stop properties by virtue of its high density, e.g., a density of about 2.67 to about 2.77 $g/cm^3$. thereby improving the accuracy and reliability of interconnects for subsequent metallization levels.

The present invention enables the formation of extremely reliable Cu and/or Cu alloy interconnect members by enhancing the adhesion and increasing the density of a capping layer, such as silicon nitride, thereon. The removal or substantial reduction of a thin copper oxide film from the surface of the Cu and/or Cu alloy interconnect member by treatment with a plasma containing ammonia and nitrogen and plasma deposition of the capping layer in the presence of nitrogen significantly improves the reliability of the Cu and/or Cu alloy interconnect member by enhancing adhesion of the high density plasma capping layer with an attendant reduction in copper diffusion and increase in electromigration resistance. The use of high density plasma conditions in forming the silicon nitride capping layer results in increased adhesion of the capping layer and increased density, thereby advantageously enabling the high density plasma silicon nitride barrier layer to function effectively as an etch stop layer furring formation of subsequent metallization levels. Consequently, the present invention advantageously reduces barrier layer peeling, reduces copper diffusion, enhances electromigration resistance, improves device reliability, increases production throughput and reduces manufacturing costs.

The present invention enjoys industrial applicability in the formation of various types of inlaid Cu and Cu alloy metallization interconnection patters. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising:

treating a surface of a copper (Cu) or Cu alloy layer with a plasma in flowing nitrogen and in flowing ammonia in a reaction chamber to reduce copper oxide on the surface; and in-situ forming a barrier layer on the treated surface of the Cu or Cu alloy layer under high density plasma conditions in the presence of nitrogen in the same reaction chamber.

2. The method according to claim 1, comprising forming a silicon nitride barrier layer on the treated surface of the Cu or Cu alloy layer by introducing silane into the reaction chamber.

3. The method according to claim 2, comprising:

treating the surface with the plasma in flowing ammonia and in flowing nitrogen for up to 30 seconds to reduce the copper oxide; and then introducing silane into the reaction chamber to deposit the silicon nitride barrier layer.

4. The method according to claim 3, comprising treating the surface with the plasma in flowing ammonia and in flowing nitrogen for about 1 to about 5 seconds before introducing silane.

5. The method according to claim 4, comprising treating the surface of the Cu or Cu alloy layer with the plasma at:

an ammonia flow rate of about 100 to about 6,000 sccm;

a nitrogen flow rate of about 500 to about 6,000 sccm;

a high frequency power of about 100 to about 1,000 watts;

a low frequency power of about 50 to about 500 watts;

a temperature of about 300° C. to about 450° C.; and a pressure of about 1.2 Torr. to about 4.0 Torr.

6. The method according to claim 5, comprising depositing the silicon nitride barrier layer under high density plasma conditions at:

a silane flow rate of about 20 to about 1,000 sccm;

an ammonia flow rate of about 100 to about 6,000 sccm;

an nitrogen flow rate of about 500 to about 6,000 sccm;

a high frequency power of about 100 to about 1,000 watts;

a low frequency power of about 50 to about 500 watts;

a temperature of about 300° C. to about 450° C.; and a pressure of about 1.2 Torr. to about 4.0 Torr.

7. The method according to claim 6, comprising depositing the silicon nitride barrier layer under high density plasma conditions for about 0.5 to about 5 seconds.

8. The method according to claim 7, comprising depositing the silicon nitride barrier layer at a thickness of about 150 Å to about 1,000 Å.

9. The method according to claim 7, wherein the deposited silicon nitride barrier layer has a density of about 2.67 to about 2.77 g/cm$^3$.

10. The method according to claim 1, comprising introducing silane into the reaction chamber to form the barrier layer under plasma conditions essentially the same as plasma conditions employed during treating the Cu or Cu alloy surface.

* * * * *

UNITED STATES PATENT AND TRADEMARK OFFICE
CERTIFICATE OF CORRECTION

PATENT NO.    : 6,383,925 B1
DATED         : May 7, 2002
INVENTOR(S)   : Minh Van Ngo et al.

It is certified that error appears in the above-identified patent and that said Letters Patent is hereby corrected as shown below:

<u>Title page, Item 54 and Column 1, line 2,</u>
Title, change "COOPER" to -- COPPER --;

Item [75], change the city of residence of the first inventor from "Freemont" to -- Fremont --.

Signed and Sealed this

Twenty-fifth Day of June, 2002

*Attest:*

*Attesting Officer*

JAMES E. ROGAN
*Director of the United States Patent and Trademark Office*